United States Patent
Ishida et al.

(10) Patent No.: US 6,355,528 B1
(45) Date of Patent: Mar. 12, 2002

(54) METHOD TO FORM NARROW STRUCTURE USING DOUBLE-DAMASCENE PROCESS

(75) Inventors: Emi Ishida, Sunnyvale, CA (US); Scott Luning, Austin, TX (US); Tim Thurgate, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/426,911

(22) Filed: Oct. 26, 1999

Related U.S. Application Data (60) Provisional application No. 60/148,395, filed on Aug. 11, 1999.

(51) Int. Cl.⁷ .............................................. H01L 21/336
(52) U.S. Cl. ....................... 438/269; 438/289; 438/301; 438/947
(58) Field of Search ................................ 438/264, 269, 438/282, 289, 291, 298, 301, 302, 305, 947

(56) References Cited

U.S. PATENT DOCUMENTS

| | | | | |
|---|---|---|---|---|
| 5,082,794 A | * | 1/1992 | Pfiester et al. | 437/40 |
| 5,374,574 A | * | 12/1994 | Kwon | 437/44 |
| 5,374,575 A | | 12/1994 | Kim et al. | 437/40 |
| 5,391,510 A | | 2/1995 | Hus et al. | 437/44 |
| 5,534,447 A | | 6/1996 | Hong | 437/27 |
| 5,597,752 A | * | 1/1997 | Niwa | 437/44 |
| 5,686,321 A | * | 11/1997 | Ko et al. | 437/29 |
| 5,834,355 A | | 11/1998 | Doyle | 438/305 |
| 5,891,773 A | * | 4/1999 | Saitoh | 438/259 |
| 5,899,719 A | * | 5/1999 | Hong | 438/289 |
| 5,904,530 A | * | 5/1999 | Shin | 438/291 |
| 5,918,132 A | | 6/1999 | Qian et al. | 439/299 |
| 5,985,726 A | | 11/1999 | Yu et al. | 438/301 |
| 6,077,747 A | | 6/2000 | Nakamura | 438/291 |
| 6,155,537 A | * | 12/2000 | Yang | 254/314 |
| 6,214,670 B1 | * | 4/2001 | Shih et al. | 438/259 |

FOREIGN PATENT DOCUMENTS

JP 04123439 4/1992

OTHER PUBLICATIONS

Patent Abstracts of Japan, Pub. No.: 11068090, Pub. date: Mar. 9, 1999; App. date: Aug. 26, 1997, App. No.: 09229279; Applicant: NEC Corp; Inventor: Nakamura Norio; Title: Manufacture of Semiconductor Device.

Patent Abstracts of Japan, Pub. No.: 04123439, Pub. date: Apr. 23, 1992; App. date: Sep. 14, 1990, App. No.: 02242508; Applicant: Toshiba Corp; Inventor: Ushiku Yukihiro; Title: Manufacture of Semiconductor Device.

* cited by examiner

*Primary Examiner*—John F. Niebling
*Assistant Examiner*—Walter L. Lindsay, Jr.
(74) *Attorney, Agent, or Firm*—Fliesler, Dubb, Meyer & Lovejoy LLP (57) ABSTRACT

A narrow groove is formed over a substrate. To form such a narrow groove, a first material is formed over a substrate, the first material having a sidewall. A spacer is formed abutting the sidewall. Subsequently a second material is formed adjacent to the spacer. The spacer is removed leaving a groove between the first material and second material. In one embodiment, the groove is filled with material for a narrow feature, such as a gate, and the first material and second material are removed. As a result a gate or other narrow feature is formed having a length defined by the width of a spacer. In another embodiment, an implant is performed through the small groove, resulting in a small localized implant.

13 Claims, 9 Drawing Sheets

METHOD TO FORM NARROW STRUCTURE USING DOUBLE-DAMASCENE PROCESS

RELATED APPLICATION

This application claims the benefit of U.S. Provisional Application No. 60/148,395, filed Aug. 11, 1999.

FIELD OF THE INVENTION

This invention relates to semiconductor formation, and in particular to gate structure formation in MOSFET devices.

BACKGROUND

One trend in the semiconductor industry is to make semiconductor devices as small as possible. Often, however, process technology, or the methods used in forming many devices, impose limitations on how small a device can be made.

Figure 1:
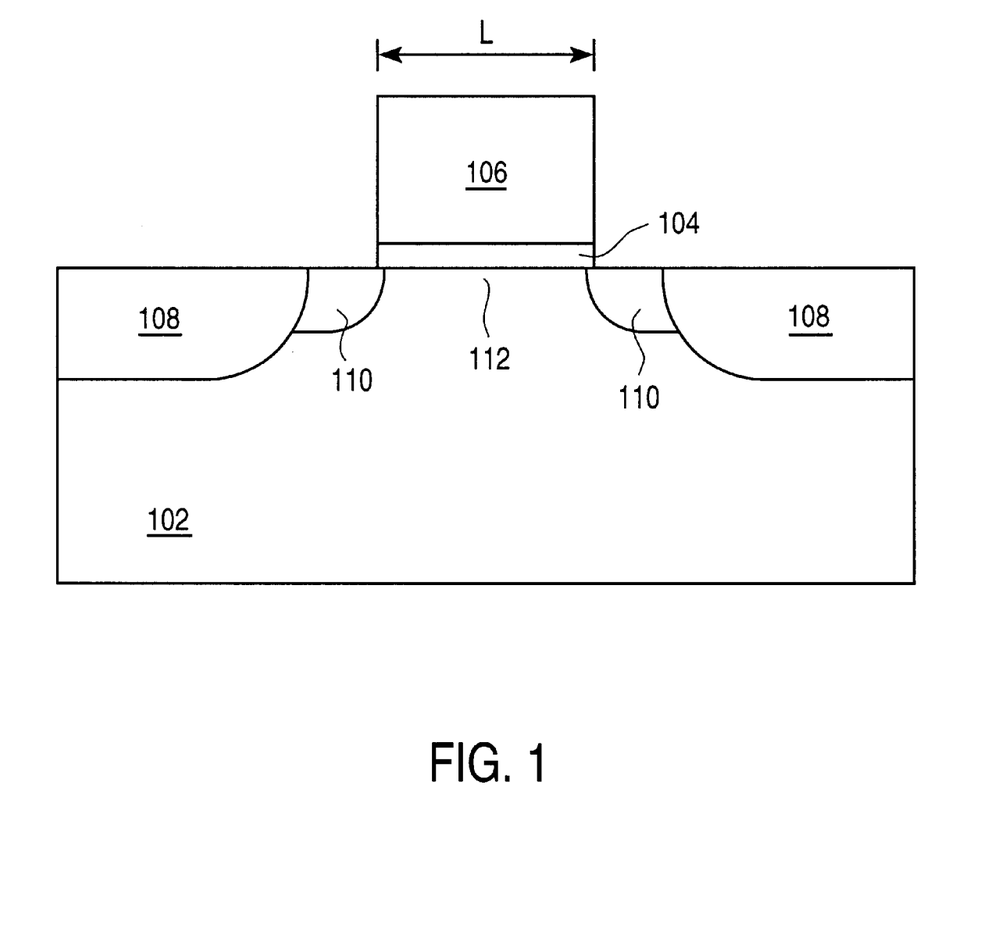
FIG. 1 is a cross-sectional view of a MOSFET device.

A typical semiconductor device and a primary building block in the semiconductor industry is the metal oxide semiconductor field effect transistor (MOSFET). A cross-section of a MOSFET is shown in FIG. 1. A MOSFET is typically composed of a gate 106 and an insulating gate layer 104, both formed over silicon substrate 102. Gate 106 is usually composed of polysilicon. Within substrate 102 are formed deep source-drain regions 108 (sometime referred to as heavily doped source and drain regions) and source-drain extension regions 110 (sometimes referred to as lightly-doped source and drain regions. Generally, doped regions are regions containing a higher concentration of p-type or n-type dopants than the rest of the substrate. Source-drain extension regions 130 generally have a lower concentration of dopants compared to deep source-drain regions 150 although some technologies allow the regions to be doped at equivalent levels. The region in the substrate directly below the gate 106 is typically referred to as channel region 112.

Referring to the cross-sections shown in FIG. 2, a brief explanation of the formation of a MOSFET device is given. In FIG. 2A, substrate 102 is doped, by ion implantation or other doping techniques. The doping in FIG. 2A is used to control the characteristics of the channel region 112. After the channel implant, an oxide layer 104 is grown or deposited, over which oxide layer is formed polysilicon layer 106, as shown in FIG. 2B. In FIG. 2C, layers 104 and 106 are patterned and etched leaving a gate stack formation 107. Source-drain extension regions 110 are next formed by introducing dopants into the substrate on either side of the gate stack 107, often with an ion implantation technique, as shown in FIG. 2D. Once the extension regions 110 have been implanted, a spacer forming material 114, such as oxide, is deposited over the entire structure as shown in FIG. 2E. Spacer forming material 114 is then anisotropically etched to form spacers 116 abutting the sidewalls of gate stack 107, FIG. 2F. In FIG. 2G, following the formation of spacers 116, deep source-drain regions 108 are formed, often using ion implantation.

In reducing the size of MOSFET devices, much of the focus has been on reducing the length L of the gate 106. The smallest gate lengths that can be achieved using the process described with respect to FIG. 2 are limited by the lithographic techniques used.

To be able to achieve a gate length that is smaller than that which can be produced using solely lithographic techniques, the technique in FIG. 3 has been utilized, a so-called "inverse" process. As shown in FIG. 3A, a channel implant is performed, similar to that done in FIG. 2A, to form channel region 312. In FIG. 3B, a sacrificial layer 304 such as nitride is grown or deposited. In FIG. 3C, layer 304 is patterned and etched to form a groove 306. Following groove formation, in FIG. 3D a spacer formation layer 308, such as oxide, is formed over the structure and then anisotropically etched to form spacers 310 shown in FIG. 3E. In FIG. 3F, an oxide layer 314 is grown or deposited at the bottom of the exposed portion of groove 306. In FIG. 3G, a gate material layer 316, such as polysilicon is deposited over the structure, and then a planarization technique, such as a chemical-mechanical polish (CMP), is used to planarize the structure as shown in FIG. 3H. Subsequently, in FIG. 3I, spacers and sacrificial layer 304 are removed leaving gate 316. Once gate 316 has been formed, the steps described with respect to FIGS. 2D–2G would be followed in forming a MOSFET device.

The technique described in FIG. 3 allows a gate to be made slightly smaller than that defined by the minimum gate length permitted by a straight lithographic process. The smallest gate length permitted by the process of FIG. 3 is equal to $L_{min}$ minus two times the spacer width ($L_{min}-(2\times$ spacer width))), where $L_{min}$ is the smallest feature dimension achievable with the lithographic process utilized. Even using the techniques of FIG. 3, the smallest gate lengths that have been achieved have been only approximately 0.18 µm.

Figure 2A:
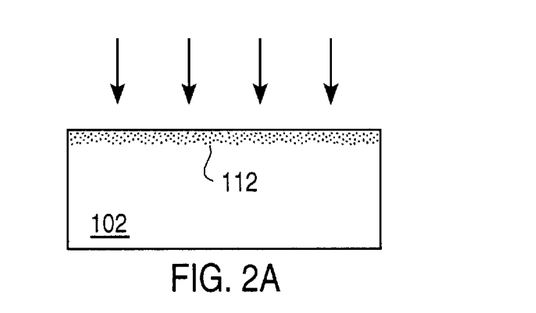
FIGS. 2A–2G, are cross-sectional views showing a MOSFET device in various stages of formation.
Figure 2B:
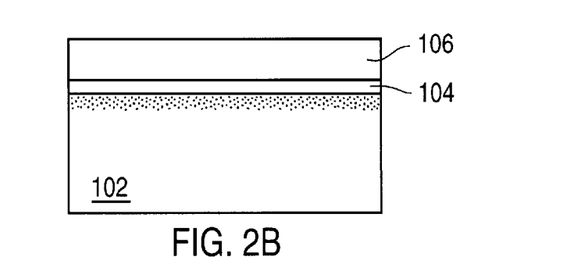
Figure 2C:
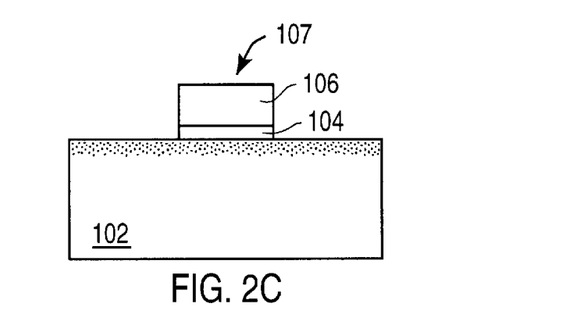
Figure 2D:
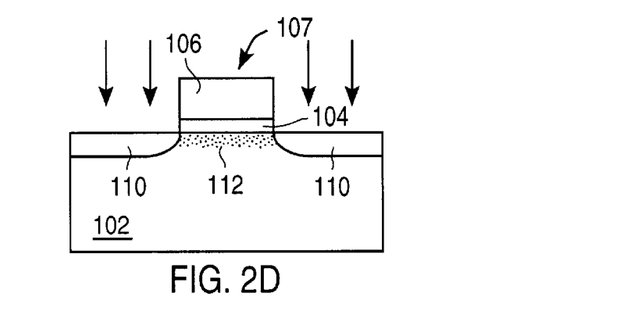
Figure 2E:
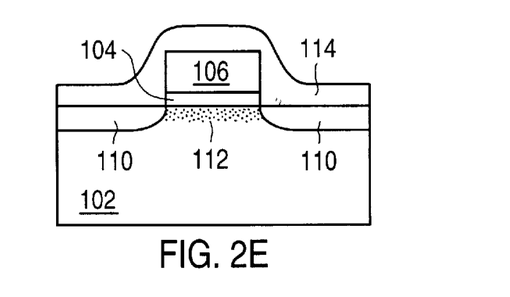
Figure 2F:
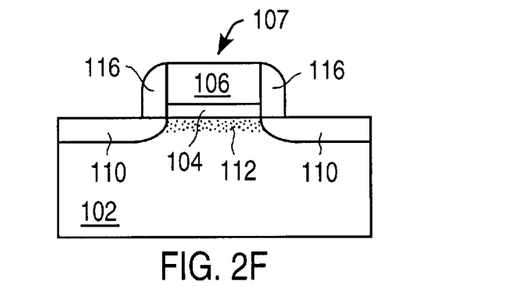
Figure 2G:
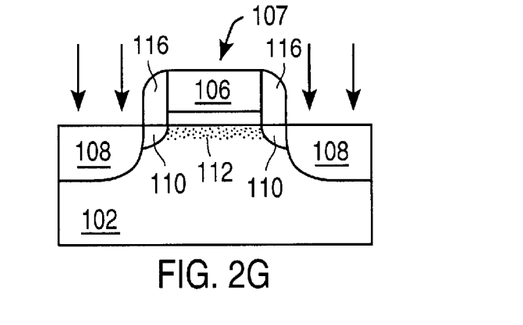
Figure 3A:
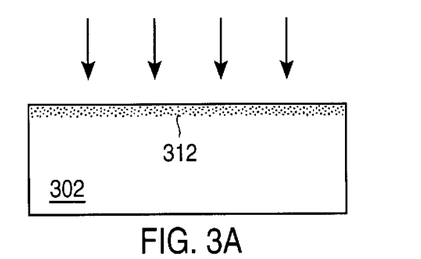
FIGS. 3A–3I, are cross-sectional views showing aMOSFET device in various stages of formation using an alternative technique.
Figure 3B:
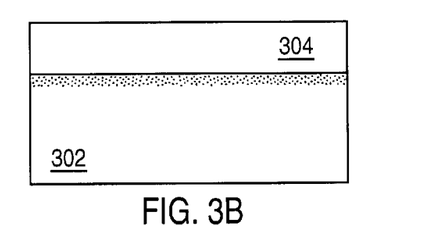
Figure 3C:
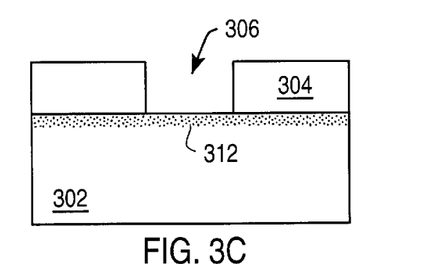
Figure 3D:
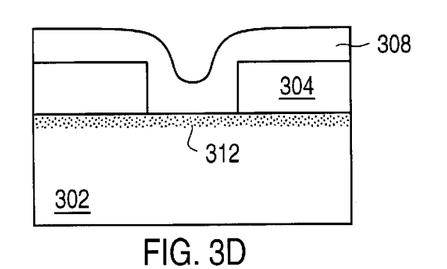
Figure 3E:
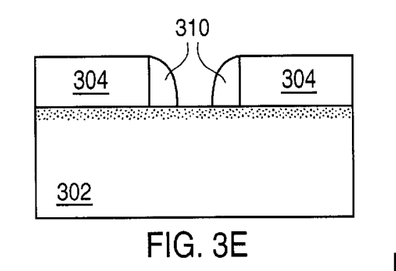
Figure 3F:
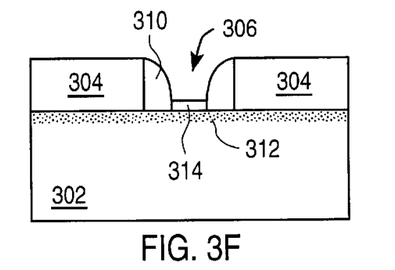
Figure 3G:
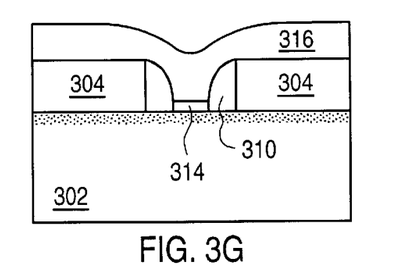
Figure 3H:
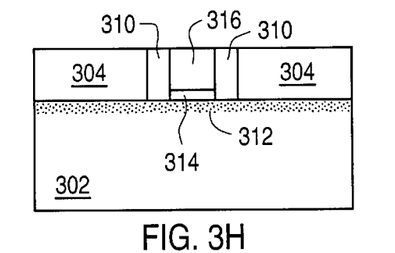
Figure 3I:
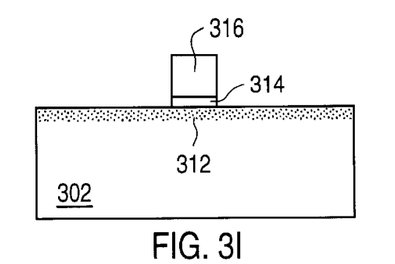

Forming smaller and more reliable devices also depends on the doping techniques utilized. Using current techniques, however, while control can be had of the type of dopants and the depth of their implant, only limited control exits as to localizing their placement. Referring to FIG. 2, as shown in FIG. 2A, channel doping occurs not only in what will ultimately form the channel region, but also occurs throughout the surface of the substrate 102. As well, source-drain extension region implants, FIG. 2D, are masked by the gate, and hence form doped regions immediately adjacent to the gate, but these regions also extend to the right and left across the exposed substrate region.

Further, it is often desirable to implant dopants underneath the gate region 106. Such implants can only currently be achieved using an angled implant. Nonetheless, this implant is still not localized, i.e., it will still extend into the regions that will become the deep source-drain regions.

SUMMARY

To overcome the limitations described above, a method in accordance with the invention has been devised that allows a gate structure to be formed smaller than 0.18 µm despite limitations in the lithographic process. In accordance with the invention, gate structures can be found that are defined by the size of a spacer. Hence, rather than limitations in the lithographic process defining the smallest feature dimensions, spacer dimensions define the smallest features. Using a process in accordance with the invention, gates having a length L on the order of 100 Å can be achieved.

More specifically one embodiment of a method in accordance with the invention forms a sidewall material over a substrate, the sidewall material having a sidewall. A spacer is formed abutting said sidewall. Subsequently, a second material is formed adjacent to the spacer. In one embodiment the second material is the same as the sidewall material. The spacer is then removed, forming a groove between the sidewall material and the second material. The groove is filled with the material to be used to form a narrow feature, such as a gate. The sidewall material and second material are then removed, leaving a resulting narrow feature.

Further, a method in accordance with the invention has been devised that allows for forming localized doped regions in a substrate. Specifically one embodiment of a method in accordance with the invention forms a sidewall material having a groove formed therein, the groove being defined on either side by a sidewall. Spacers are formed abutting the sidewalls. Subsequently a mid-region material is formed in the groove adjacent to the spacers. The spacers are removed resulting in a pair of grooves. An implant is performed through the grooves, resulting in a localized implant.

In one embodiment, the mid-region material is formed of polysilicon. After forming localized implanted regions, the sidewall material is removed. The result is a semiconductor device with a polysilicon gate having localized implanted regions to either side of the gate edges. In one embodiment such localized implanted regions can form source-drain extensive regions.

In another embodiment of the invention, mid-region material is sacrificial and is removed following the localized implant. A gate material is then placed in the re-formed groove defined by the sidewall material. Once the gate material is in place, the sidewall material is removed. The result is a semiconductor device having localized implanted regions underneath the gate. Such localized implanted regions may be used in some embodiments to control channel characteristics.

BRIEF DESCRIPTION OF THE DRAWINGS

The invention will be described with respect to particular embodiments thereof, and reference will be made to the drawings in which like numbers designate like parts and in which:

FIG. 2, including

FIG. 3, including

FIG. 4, including

FIG. 5, including

FIG. 6, including

FIG. 7, including

FIG. 11, including

DETAILED DESCRIPTION

Disclosed herein is a structure in accordance with the invention that forms one or more grooves. The grooves are defined by the width of spacers. A structure with such grooves is useful in several processes used to form semiconductor devices. One such use is in forming a narrow feature such as a gate structure. A second use is in forming small localized implanted regions. More specific details are discussed below.

As shown in FIG. 4, one embodiment in accordance with the invention is demonstrated. FIG. 4A shows substrate 402 over which has been formed sidewall material layer 404. Sidewall material layer 404 is formed of a material that can later be selectively etched with respect to silicon. One such material is nitride. As shown in FIG. 4B, sidewall material layer 404 is patterned and etched to form groove 406. Alternatively, rather than forming layer 404 over substrate 402, substrate 402 can be patterned and etched to form a groove directly in substrate 402.

Next, spacers are formed to abut sidewalls of the groove 406. First a spacer forming layer 408 is grown, deposited, or otherwise formed over substrate 402 and layer 404. The spacer forming layer 408 is anisotropically etched to form spacers 410, as shown in FIG. 4D. The spacer material should be selected so that it can be selectively removable with respect to sidewall material 404. If nitride were chosen for sidewall material layer 404, oxide is a suitable choice for spacers 410.

Figure 4A:
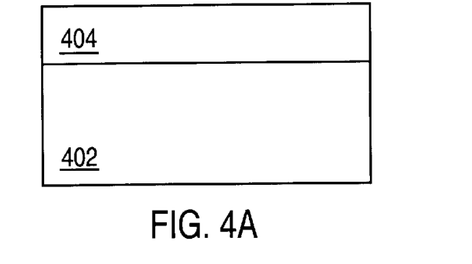
FIGS. 4A–4G, shows cross-sectional views of a semiconductor device in various stages of formation and illustrates the first steps used in accordance with the invention.
Figure 4B:
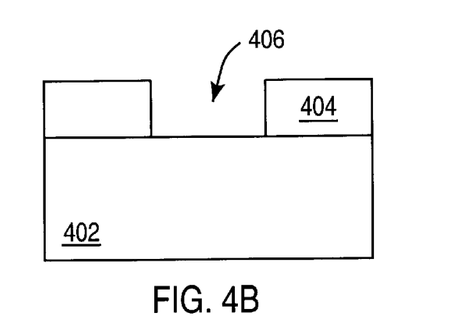
Figure 4C:
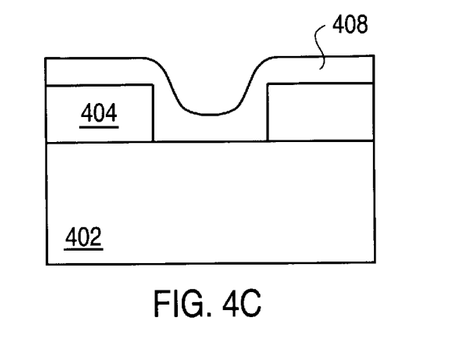
Figure 4D:
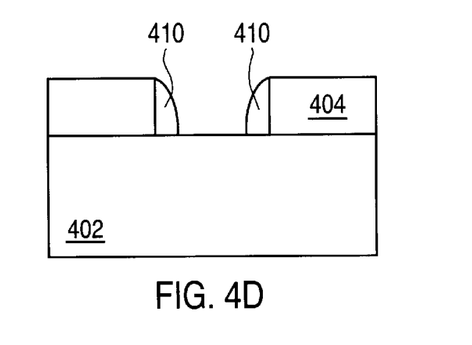
Figure 4E:
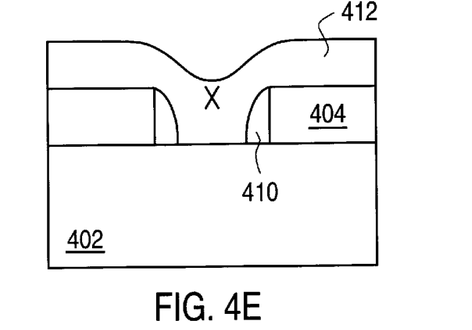
Figure 4F:
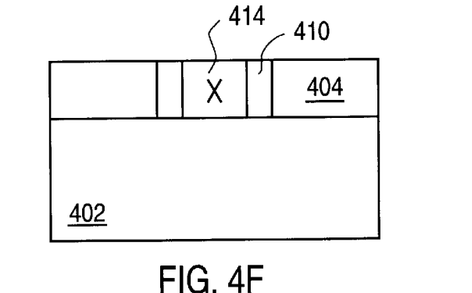
Figure 4G:
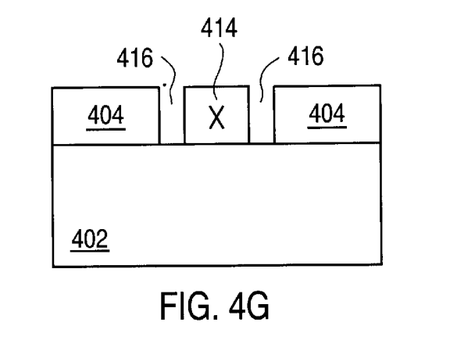

In FIG. 4E, a layer of an unnamed material 412, referred to herein as material X, is then formed over the structure, for instance by deposition. The composition of material X will vary as will become clear from the discussion below. The structure is than planarized, for instance using a chemical-mechanical polish (CMP). The result is shown in FIG. 4F, where material X forms a mid-region 414 between spacers 410. Subsequently, as shown in FIG. 4G, the spacers 410 are removed, in one embodiment using a wet etchant, which is selective to the sidewall material and to material X, resulting in grooves 416. As will be demonstrated, the structure resulting from FIG. 4G is useful for a variety of applications.

Figure 5A:
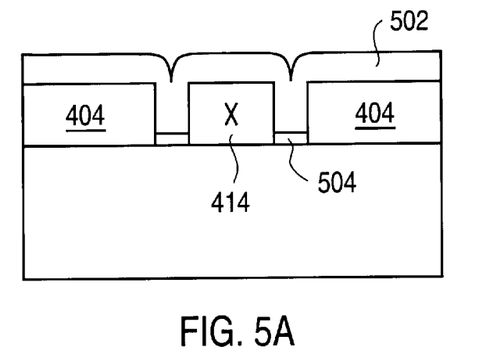
FIGS. 5A–5C, shows cross-sectional views of a semiconductor device and illustrates steps used to form a narrow feature, such as a gate, in accordance with the invention.
Figure 5B:
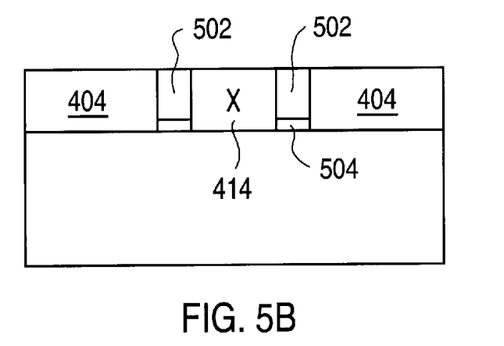
Figure 5C:
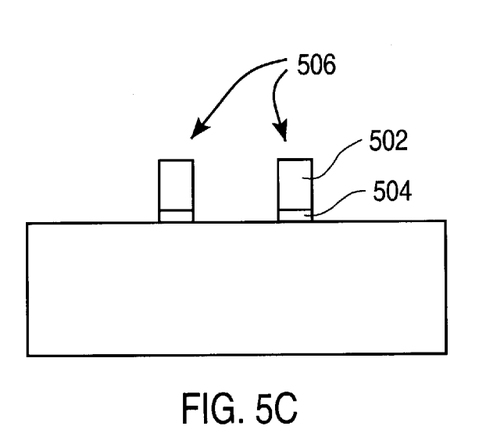

One use for structure of the FIG. 4G is for forming a narrow gate structure or other narrow feature. Referring to FIG. 5A, the material 502 to be used to form the narrow feature is deposited over the structure of FIG. 4G. If the narrow feature is to be a gate structure, the material layer 502 may be composed of polysilicon in one embodiment of the invention. Further, if the narrow feature is to be a gate structure, a gate insulator 504, such as oxide, is deposited, grown, or otherwise formed in the groove areas 416 before depositing the narrow feature material 502. As shown in FIG. 5B, after depositing layer 502, the structure is planarized using a CMP process in one embodiment. Subsequently, the sidewall material layer 404 and material X 414 are selectively removed. Since material X is sacrificial, being removed at the same time as sidewall material 404, material X can be the same material, e.g., nitride, as that used to form the sidewall material 404 in one embodiment. The result as shown in FIG. 5C is a pair of narrow features 506, which may be used as gate structures.

If only one such structure 506 is desired, then following the step illustrated in FIG. 4D, a mask is placed over half of the illustrated structure, covering one of the sidewalls and spacers defined. The second spacer is then etched away.

Figure 6A:
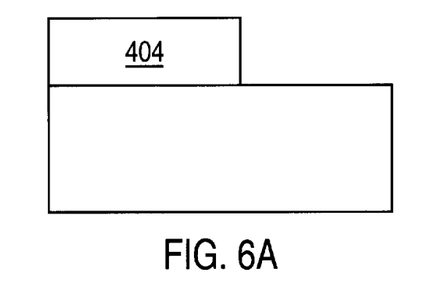
FIGS. 6A–6C, shows cross-sectional views of a semiconductor device and illustrates steps used to form a narrow feature, such as a gate, in accordance with an alternative embodiment of the invention.
Figure 6B:
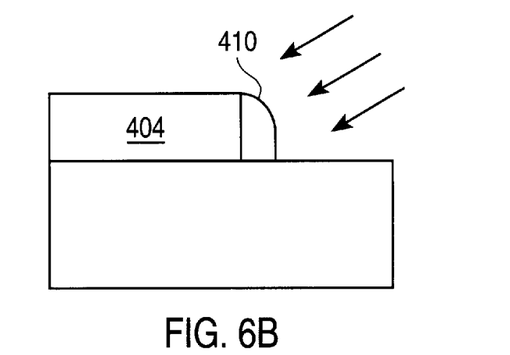
Figure 6C:
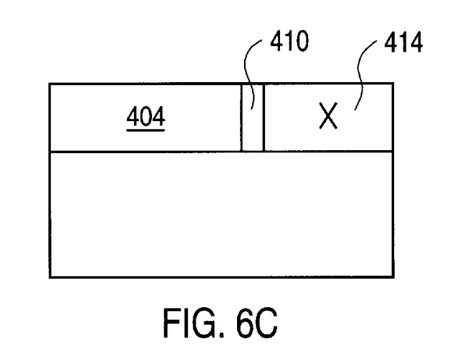

Alternatively, to form only one feature, rather than forming a groove, only one side of the sidewall material 404 is formed by traditional mask and etch techniques, resulting in the structure shown in FIG. 6A. Spacer 410 is formed by angled deposit as shown in FIG. 6B, by the technique described with respect to FIGS. 4C and 4D (deposit and anisotropic etch), or by any other method of forming a spacer. Subsequently, the material X 414, which may be identical to the sidewall material in one embodiment, is deposited and the entire structure planarized, as shown in FIG. 6C. The spacer can then be selectively removed and a single narrow feature 506 formed, as discussed with reference to FIGS. 5A–5C.

The result of using the techniques of FIGS. 4–6 is that gates can be formed having a length of approximately 100 Å. In other words, the processes defined in FIGS. 4–6, form features that are limited only by the spacer width and not by the lithographic process.

Figure 7A:
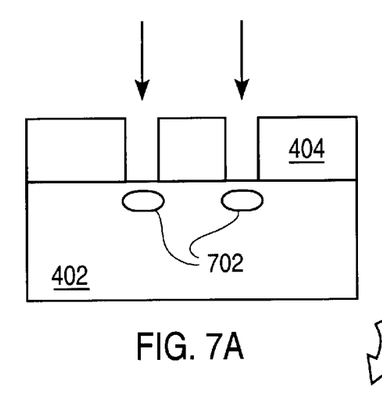
FIGS. 7A–7E, shows cross-sectional views of a semiconductor device and illustrates steps used to form localized implanted regions in accordance with the invention.

A second use of the structure of FIG. 4G is in the formation of localized implant regions. Referring to FIG. 7A, the substrate can be implanted through the groove regions 416 to form implanted regions 702. Such an implant can be used as a channel implant for the narrow gate feature formed following the steps of FIG. 5. Alternatively, if material X 414 is formed of polysilicon, regions 404 can be removed and region 414 can ultimately be used as the gate region as shown in FIG. 7E. The regions 702 in FIG. 7E form localized doped regions on either side of the gate 414.

Figure 7B:
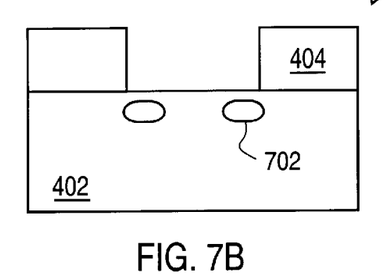
Figure 7C:
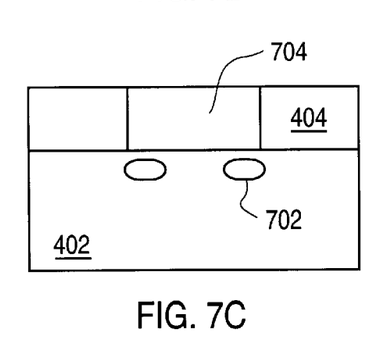
Figure 7D:
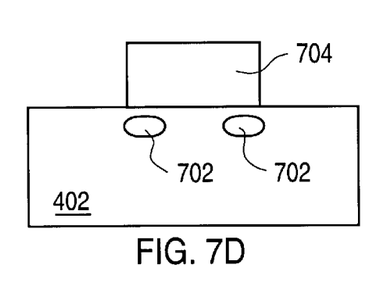
Figure 7E:
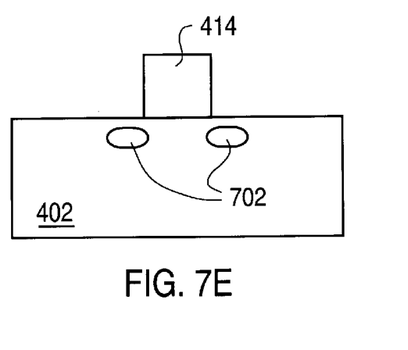

In other embodiments, however, after implanting localized regions 702 in FIG. 7A, material X 414 is removed as shown in FIG. 7B. In such a case, material X should be chosen so that it is selectively removable with respect to sidewall material 404 as well as substrate 402. Subsequently, a gate material 704, such as polysilicon, is deposited over the structure of FIG. 7B and a planarization process, such as CMP, is performed, resulting in the structure shown in FIG. 7C. The sidewall material 404 is then selectively removed, resulting in the structure shown in FIG. 7D. As shown in FIG. 7D, the resulting structure includes a gate 704 having implanted regions underneath its edges. It is to be understood that a gate insulating layer could also be included in either of the resulting structures shown in FIGS. 7D and 7E.

The result of following either of the processes defined in FIG. 7 (one resulting in FIG. 7E and one resulting in FIG. 7D) is that sharper, vertically modulated implanted regions are formed either in localized areas under the gate edges or in a localized areas just outside the gate edges.

Figure 8:
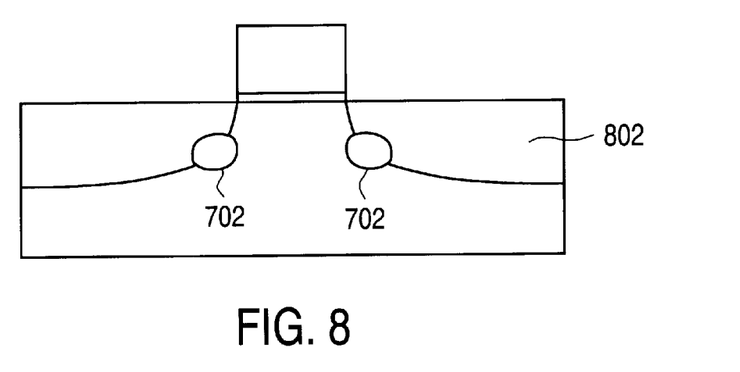
FIGS. 8, 9, and 10 show cross-sectional views of a semiconductor device where each illustrates an alternative embodiment of the invention.

Such localized doped regions can be used, for example, for controlling the doped channel profile. For instance, as shown in FIG. 8, regions 702 can be used to counter-dope source-drain regions 802 once formed. In counter-doping the source-drain regions 802, regions 702 are formed below the substrate surface following the steps of either 7A and 7E or 7A–7D. Source-drain regions 802 are then implanted. For example, in a p-type substrate where source-drain regions 802 are n-type, regions 702 would be p-type, counter-doping the selected portions of the source-drain regions 802. Under current technology, achievement of such counter-doping requires the use of a high angle tilt implant performed with specialized equipment. Still, conventional techniques will jeopardize the integrity of the gate oxide. Yet, using a counter-doping technique in accordance with the invention as shown in FIG. 8, allows the formation of a counter-doped region without the disadvantages of conventional techniques, also allowing such a region to appear to be effectively electrically shallow.

Figure 9:
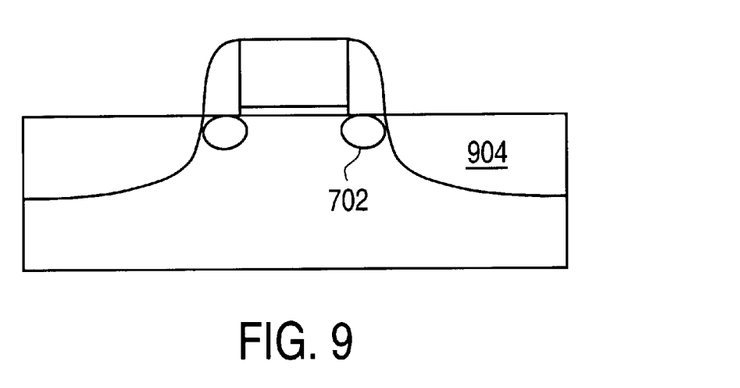

Alternatively, as shown in FIG. 9, regions 702 can also be used to form controlled, localized extension regions, which are formed without the extended doping to the right and left of conventional methods. The regions 702 are implanted at the substrate surface following the steps of 7A and 7E. Subsequently spacers can be formed and deep source-drain regions 904 implanted.

Figure 10:
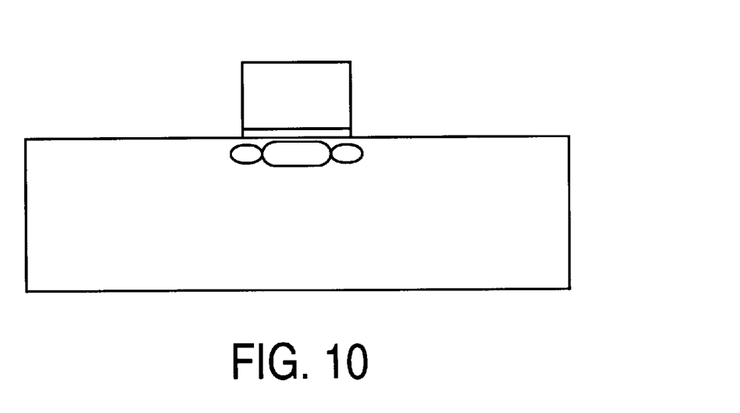
Figure 11A:
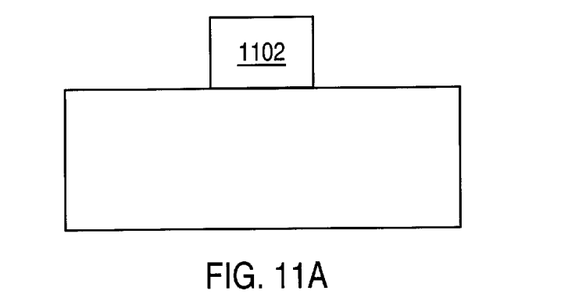
FIGS. 11A–11D shows a cross-sectional view of a semiconductor device and illustrates an embodiment of the invention that pre-forms source-drain regions.
Figure 11B:
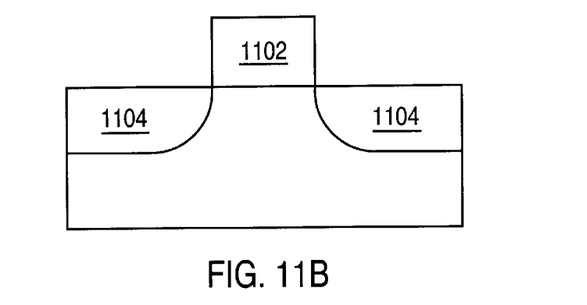
Figure 11C:
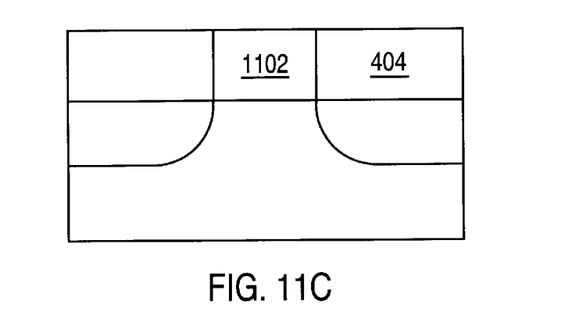
Figure 11D:
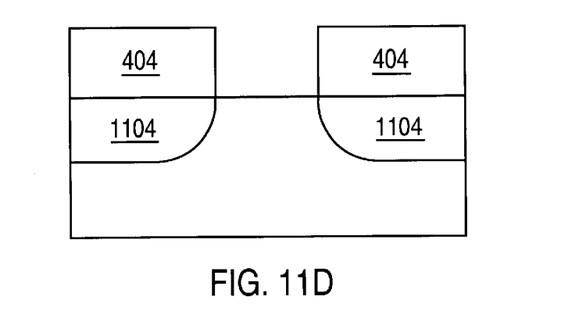

In still another embodiment of the invention, controlled channel doping can occur by performing an implant step either following the steps shown in FIG. 4B or shown with respect to FIG. 4D. FIG. 10 shows a resulting controlled channel profile when a channel implant is performed between the steps of FIG. 4D and FIG. 4E and then following the steps of FIGS. 7A–7D.

The process described with respect to FIGS. 7 through 10, allows direct access to the substrate at or under the gate edge and allows controlled localized implants of channel or extension regions without additional doping of source-drain regions, reducing the variation of electrical characteristics resulting from the gate width.

Once the gate region is formed, as shown in FIG. 7 (either 7D or 7E), and sidewall material has been removed, source-drain regions can be formed as shown in FIG. 2. Alternatively, the source-drain regions can be formed prior to the steps of FIGS. 4 and 7 as follows. Referring to FIG. 11, in FIG. 11A, a sacrificial gate 1102 is first formed over substrate 402. Subsequently, source-drain implants 1104, and source-drain extension region implants (not shown) if desired, can be formed adjacent to the sacrificial gate 1102, resulting in the structure of FIG. 11B. Subsequently, sidewall material 404, such as nitride, can be deposited adjacent to the sacrificial gate 1102 and planarized. The sacrificial gate 1102 is then selectively removed resulting in the structure shown in FIG. 11D. The steps of FIGS. 4 and 7 would then be followed.

Hence, a process in accordance with the invention has been described that allows for ultra-narrow gate formation on the order of 100 Å. In addition, a process in accordance with the invention has been described that allows for controlled and localized implantation of the channel region and source-drain extension regions, allowing for improved and better controlled electrical characteristics across the gate length.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A method of forming a semiconductor device, comprising the steps of:
   a) forming a sidewall material layer having a sidewall;
   b) forming a spacer abutting said sidewall;
   c) forming a second material adjacent to said spacer;
   d) removing said spacer to form a groove between said sidewall and said second material;
   e) filling said groove with a narrow-feature material;
   f) removing said sidewall and said second material.

2. The method of claim 1, wherein said second material is the same as said sidewall material.

3. The method of claim 1, wherein:
   said step (b) further includes the steps of:
   forming a spacer-forming layer over said sidewall material layer;
   anisotropically etching said spacer-forming layer to form a spacer.

4. The method of claim 1, wherein said step (c) includes:
   forming a second material layer over said sidewall material layer, over said spacer, and adjacent to said spacer; and
   planarizing said second material layer, said spacer, and said sidewall material layer.

5. The method of claim 1, wherein said step (e) includes filling said groove with polysilicon.

6. A method of forming a semiconductor device, comprising the steps of:
   a) forming a sidewall material layer having a groove therein defined by sidewalls;
   b) forming a pair of spacers abutting said sidewalls;
   c) forming a mid-region material in said groove and between said spacers;
   d) planarizing said sidewall material, said spacers and said mid-region material;
   e) removing said spacers to form a pair of small grooves;
   f) filling each groove in said pair of small grooves with a narrow-feature material;
   g) removing said mid-region material and said sidewall material layer.

7. The method of claim 6, wherein said mid-region material is the same as said sidewall material.

8. The method of claim 6, wherein said step (b) further includes the steps of:
   forming a spacer-forming layer over said sidewall material layer;
   anisotropically etching said spacer-forming layer to form said spacers.

9. The method of claim 6, wherein said step (i) includes filling said small grooves with polysilicon.

10. A method for forming a semiconductor device with a substrate, comprising the steps of:
   forming a sidewall material layer having a large groove therein defined by a pair of sidewalls;
   forming a second material layer within said large groove, said second material layer separated from said sidewall material layer by a pair of small grooves, where the width of each of said grooves is defined by the width of a spacer;
   forming, through each of said small grooves, a pair of localized implants in said substrate;
   removing said second material layer to reform said large groove;
   forming a gate material layer within said large groove;
   removing said sidewall material.

11. A method of forming a semiconductor device, comprising the steps of:
   (a) forming a sidewall material layer having a first groove therein defined by sidewalls;
   (b) forming a pair of spacers abutting said sidewalls;
   (c) forming a mid-region material in said first groove and between said spacers;
   (d) removing said spacers to form a pair of small grooves, said small grooves being small relative to said first groove;
   (e) implanting, through said pair of grooves, a pair of localized regions in said substrate;
   (f) removing said mid-region material, reforming said first groove;
   (g) forming a gate material in said first groove;
   (h) removing said sidewall material.

12. The method of claim 11, wherein said mid-region material is selectively removable with respect to said sidewall material.

13. A method of forming a semiconductor device, comprising the steps of:
   a) forming a sidewall material layer having a first groove therein defined by sidewalls;
   b) forming a pair of spacers abutting said sidewalls;
   c) forming a mid-region material in said first groove and between said spacers;
   d) removing said spacers to form a pair of smaller grooves, said smaller grooves being small relative to said first groove;
   e) implanting, through said pair of smaller grooves, a pair of localized regions in said substrate;
   f) removing said mid-region material, reforming said first groove;
   g) forming a gate material in said first groove; and
   h) removing said sidewall material.

* * * * *